(12) United States Patent
Wei

(10) Patent No.: US 6,516,037 B1
(45) Date of Patent: Feb. 4, 2003

(54) MULTILEVEL CODING WITH TIME DIVERSITY

(75) Inventor: Lee-Fang Wei, Lincroft, NJ (US)

(73) Assignee: Lucent Technologies Inc., Murray Hill, NJ (US)

(*) Notice: Subject to any disclaimer, the term of this patent is extended or adjusted under 35 U.S.C. 154(b) by 0 days.

(21) Appl. No.: 09/230,650

(22) PCT Filed: Jun. 11, 1998

(86) PCT No.: PCT/US98/11615
§ 371 (c)(1),
(2), (4) Date: Jan. 28, 1999

(87) PCT Pub. No.: WO98/57473
PCT Pub. Date: Dec. 17, 1998

Related U.S. Application Data (60) Provisional application No. 60/049,596, filed on Jun. 13, 1997.

(51) Int. Cl.$^7$ .............................. H04L 23/02; H04L 5/12
(52) U.S. Cl. ....................... 375/264; 375/265; 375/298; 714/758

(58) Field of Search .................................. 375/261, 264, 375/265, 279, 280, 281, 298, 295, 308, 286; 714/758, 786, 792; 332/103

(56) References Cited

U.S. PATENT DOCUMENTS

| | | | |
|---|---|---|---|
| 5,258,987 A | * 11/1993 | Wei | 714/758 |
| 5,408,499 A | * 4/1995 | Sasaki | 332/103 |
| 6,195,396 B1 | * 2/2001 | Fang et al. | 375/261 |

\* cited by examiner

*Primary Examiner*—Betsy L. Deppe
(74) *Attorney, Agent, or Firm*—Thomas Stafford (57) ABSTRACT

A multilevel coded modulation scheme is provided in which a first portion of input data is encoded by a first-level code and a second portion of input data is encoded by an second-level code, the second-level code being such that the overall multilevel code exhibits a desired level of time diversity of at least 2 and the minimum distance of the overall code is not increased by virtue of the presence of the second-level code.

11 Claims, 8 Drawing Sheets

| 4D SUBSET | X3$_n$ | X2$_n$ | X1$_n$ | X0$_n$ | Y1$_{n+1}$ | Y0$_{n+1}$ | Y1$_n$ | Y0$_n$ | 2D-SUBSET-PAIR |
|---|---|---|---|---|---|---|---|---|---|
| 0 | 0 | 0 | 0 | 0 | 0 | 0 | 0 | 0 | (a,a) |
|   | 1 | 0 | 0 | 0 | 1 | 1 | 1 | 1 | (b,b) |
| 1 | 0 | 0 | 0 | 1 | 0 | 0 | 0 | 1 | (a,c) |
|   | 1 | 0 | 0 | 1 | 1 | 1 | 1 | 0 | (b,d) |
| 2 | 0 | 0 | 1 | 0 | 0 | 0 | 1 | 1 | (a,b) |
|   | 1 | 0 | 1 | 0 | 1 | 1 | 0 | 0 | (b,a) |
| 3 | 0 | 0 | 1 | 1 | 0 | 0 | 1 | 0 | (a,d) |
|   | 1 | 0 | 1 | 1 | 1 | 1 | 0 | 1 | (b,c) |
| 4 | 0 | 1 | 0 | 0 | 0 | 1 | 0 | 1 | (c,c) |
|   | 1 | 1 | 0 | 0 | 1 | 0 | 1 | 0 | (d,d) |
| 5 | 0 | 1 | 0 | 1 | 0 | 1 | 0 | 0 | (c,b) |
|   | 1 | 1 | 0 | 1 | 1 | 0 | 1 | 1 | (d,a) |
| 6 | 0 | 1 | 1 | 0 | 0 | 1 | 1 | 0 | (c,d) |
|   | 1 | 1 | 1 | 0 | 1 | 0 | 0 | 1 | (d,c) |
| 7 | 0 | 1 | 1 | 1 | 0 | 1 | 1 | 1 | (c,a) |
|   | 1 | 1 | 1 | 1 | 1 | 0 | 0 | 0 | (d,b) |

T : SIGNALING INTERVAL
2T : DELAY ELEMENT
(+) : EXCLUSIVE OR

BIT PATTERN: $Y_{3n}Y_{2n}$

BIT PATTERN: $Y3_n$ $Y2_n$ $Y1_n$ $Y0_n$

FIG. 13

COLUMN

| ROW | 0 | 1 | 2 | 3 | 4 | 5 | 6 | 7 | 8 | 9 | 10 | 11 | 12 |
|---|---|---|---|---|---|---|---|---|---|---|---|---|---|
| 0 | 0 | 5 | 9 | 1 | 6 | 10 | 2 | 7 | 11 | 3 | 8 | 12 | 4 |
| 1 | 130 | 135 | 139 | 131 | 136 | 140 | 132 | 137 | 141 | 133 | 138 | 142 | 134 |
| 2 | 26 | 31 | 35 | 27 | 32 | 36 | 28 | 33 | 37 | 29 | 34 | 38 | 30 |
| 3 | 156 | 161 | 165 | 157 | 162 | 166 | 158 | 163 | 167 | 159 | 164 | 168 | 160 |
| 4 | 52 | 57 | 61 | 53 | 58 | 62 | 54 | 59 | 63 | 55 | 60 | 64 | 56 |
| 5 | 182 | 187 | 191 | 183 | 188 | 192 | 184 | 189 | 193 | 185 | 190 | 194 | 186 |
| 6 | 78 | 83 | 87 | 79 | 84 | 88 | 80 | 85 | 89 | 81 | 86 | 90 | 82 |
| 7 | 208 | 213 | 217 | 209 | 214 | 218 | 210 | 215 | 219 | 211 | 216 | 220 | 212 |
| 8 | 104 | 109 | 113 | 105 | 110 | 114 | 106 | 111 | 115 | 107 | 112 | 116 | 108 |
| 9 | 234 | 239 | 243 | 235 | 240 | 244 | 236 | 241 | 245 | 237 | 242 | 246 | 238 |
| 10 | 13 | 18 | 22 | 14 | 19 | 23 | 15 | 20 | 24 | 16 | 21 | 25 | 17 |
| 11 | 143 | 148 | 152 | 144 | 149 | 153 | 145 | 150 | 154 | 146 | 151 | 155 | 147 |
| 12 | 39 | 44 | 48 | 40 | 45 | 49 | 41 | 46 | 50 | 42 | 47 | 51 | 43 |
| 13 | 169 | 174 | 178 | 170 | 175 | 179 | 171 | 176 | 180 | 172 | 177 | 181 | 173 |
| 14 | 65 | 70 | 74 | 66 | 71 | 75 | 67 | 72 | 76 | 68 | 73 | 77 | 69 |
| 15 | 195 | 200 | 204 | 196 | 201 | 205 | 197 | 202 | 206 | 198 | 203 | 207 | 199 |
| 16 | 91 | 96 | 100 | 92 | 97 | 101 | 93 | 98 | 102 | 94 | 99 | 103 | 95 |
| 17 | 221 | 226 | 230 | 222 | 227 | 231 | 223 | 228 | 232 | 224 | 229 | 233 | 225 |
| 18 | 117 | 122 | 126 | 118 | 123 | 127 | 119 | 124 | 128 | 120 | 125 | 129 | 121 |
| 19 | 247 | 252 | 256 | 248 | 253 | 257 | 249 | 254 | 258 | 250 | 255 | 259 | 251 |

MULTILEVEL CODING WITH TIME DIVERSITY

CROSS REFERENCE

This application claims priority of Provisional Application Serial No. 60/049,596 which was filed on Jun. 13, 1997; and PCT/US98/11615 application filed on Jun. 11, 1998.

BACKGROUND OF THE INVENTION

The present invention relates to multilevel coded modulation useful, for example, in wireless, or cellular, environments.

In trellis coded modulation ("TCM") schemes, trellis coding and modulation are combined such that a number of information bits are caused to be represented by a symbol which is modulated onto a carrier for transmission over a communications channel. The symbol is taken from a predetermined symbol constellation which is partitioned into a number of subsets. A particular symbol is selected to represent the information bits by first providing a portion of the information bits to a trellis encoder. The output of the encoder is used to select a subset of the constellation. The remaining, so-called uncoded, information bits are then used to select the particular symbol from the selected subset.

In particular, upon receiving a portion of the information bits, the trellis encoder, a finite state machine, transitions from a current to a next state and, as a consequence, generates the bits that identify a subset. The number of states that a trellis encoder may assume directly affects the computational burden on a receiver to recover the transmitted signal. Thus, the greater number of states of a code, the more complex the code is said to be.

It is a characteristic of trellis encoders that only certain encoder state transitions are allowed. As a result, only certain sequences of subsets—referred to as valid sequences of subsets—are allowed by the code to occur. A further result, then, is that only certain sequences of symbols taken from those subsets—referred to as valid sequences of symbols—are allowed by the code to occur. The error performance of any given TCM scheme is determined in part by its so-called minimum distance. This is the minimum of the distance between any two valid sequences of symbols, that distance being given by the square root of the sum of the squares of the distance between each corresponding pair of symbols of the two sequences.

An N-dimensional TCM scheme, in particular, utilizes N-dimensional symbols taken from a N-dimensional constellation. The N-dimensional constellation is typically comprised of a concatenation of a number of constituent lower-dimensionality constellations and each N-dimensional symbol is thus comprised of a number of lower-dimensionality signal points, which are transmitted during respective signaling intervals. The N-dimensional constellation is partitioned into N-dimensional subsets which is typically based on a partition of its constituent lower-dimensional constellation into lower-dimensional signal point subsets. Each N-dimensional subset may be comprised of several concatenations of lower-dimensional signal point subsets. As a consequence of the above, the fact that the trellis encoder allows only certain valid sequences of N-dimensional subsets means that only certain sequences of the aforementioned lower-dimensional signal point subsets are valid. Likewise, the fact that the trellis encoder allows only certain valid sequences of N-dimensional symbols means that only certain sequences of the aforementioned lower-dimensional signal points are valid. Typically, the signal points are two-dimensional (2D) signal points.

A TCM scheme is also characterized by a certain level of so-called time diversity. This parameter is equal to the minimum number of signal point positions in any two valid sequences of signal points at which the signal points are different. For example, the coding scheme has a time diversity of "2" if, given any two valid sequences of signal points, the number of signal point positions at which the signal points are different is at least equal to 2. Having a time diversity of "2" or more is advantageous in, for example, wireless environments, which are typically characterized by so-called fading channels, i.e., channels in which the signal amplitude can become too weak to carry any useful information about the transmitted signal. Nevertheless, with the time diversity of at least "2", it is still possible to recover the transmitted signal in the presence of deep fade.

In designing a specific TCM scheme, a number of parameters are traded off against each other depending on the design criteria. Among the most significant of these are bandwidth efficiency (this being the number of information bits represented by each symbol), and three of the parameters noted above—the complexity of the code, its minimum distance, and its level of time diversity.

Thus, consider the case of a coding scheme which has acceptable bandwidth efficiency, code complexity and minimum distance but does not have a desired level of time diversity for a wireless communications application. One way to increase the level of time diversity is to use a very fine partition of the constellation and an encoder having a greater number of states. As noted above, however, this gives rise to increased decoder complexity. It may also decrease the minimum distance. Another possible way to increase time diversity involves reducing the number of symbols in each subset to a lower number, thereby reducing the total number of symbols in the constellation. However, this reduces the number of the aforementioned uncoded bits that are represented by each symbol, thus reducing the bandwidth efficiency.

SUMMARY OF THE INVENTION

The present invention provides for increased time diversity while sacrificing one or more other performance parameters only to a slight extent. Coding schemes embodying the principles of the invention are so-called multilevel coded modulation schemes of a type generally known in the art comprised of a so-called first-level code and a so-called second-level code, each code receiving respective portions of the input data stream. The first-level code in and of itself does not provide the overall code with a desired level of time diversity. In accordance with the invention, however, the second-level code is chosen such that the overall code does exhibit that desired level of time diversity.

In preferred embodiments, the first-level code is a N-dimensional trellis code with N>2 which identifies sequences of signal point subsets and the signal points of the identified signal point subsets are selected as a function of the second-level code. The first-level code is such that every different pair of identified sequences of signal point subsets differ in at least M subset positions where M is the desired level of time diversity, M>1. The second-level code is such as to ensure that every different pair of valid sequences of signal points taken from the same sequence of signal point subsets differs in at least M signal point positions. This provides the overall multilevel coded modulation scheme with diversity M. Additionally, the minimum distance, as defined above, of the overall multilevel code is not increased by the use of the particular second-level code.

Advantageously, the increase in time diversity can be realized while suffering only a slight reduction in bandwidth efficiency. For example, a particularly advantageous embodiment of a multilevel code embodying the principles of the invention includes a four-dimensional, eight-state trellis code as the first-level code and a (2k+2, 2k) double parity check code as the second-level code using k=12 and using 2D 16-QAM as the constituent constellation. This embodiment exhibits a bandwidth efficiency of about 3 ⅓ bits/signal point, which is only slightly less than the bandwidth efficiency of 3 ½ bits/signal point achieved by a unilevel code using the same constellation but using only the first-level code. Moreover, it requires a decoder which is moderately more complex. However, the multilevel code exhibits a time diversity of "2" while the unilevel code exhibits only a time diversity of only M=1 (which, in actuality, means no time diversity), and it does so without sacrificing minimum distance. That is, as indicated below, the minimum distance of the overall code is not increased because of the presence of the second-level code. An advantageous trade-off is thus accomplished. By comparison, it may be possible to achieve a time diversity of M=2 using the same constellation to again achieve about the same bandwidth efficiency but employing a unilevel approach. Disadvantageously, however, such an approach will engender significantly higher decoder complexity as well as reduced minimum distance.

The prior art's motivation for using multilevel coding has been to increase the minimum distance of the code, and thereby improve its error rate performance. It turns out that certain such prior art schemes may also achieve enhanced time diversity. (See for example, my U.S. Pat. No. 5,548,615 issued Aug. 20, 1996.) The invention here comprises the class of multilevel codes of the type described above not motivated by prior art considerations. That is, the invention here is that class of multilevel codes which provide diversity M>1 but in which the minimum distance of the overall code is not increased by virtue of the presence of the second-level code.

DETAILED DESCRIPTION

Figure 1:
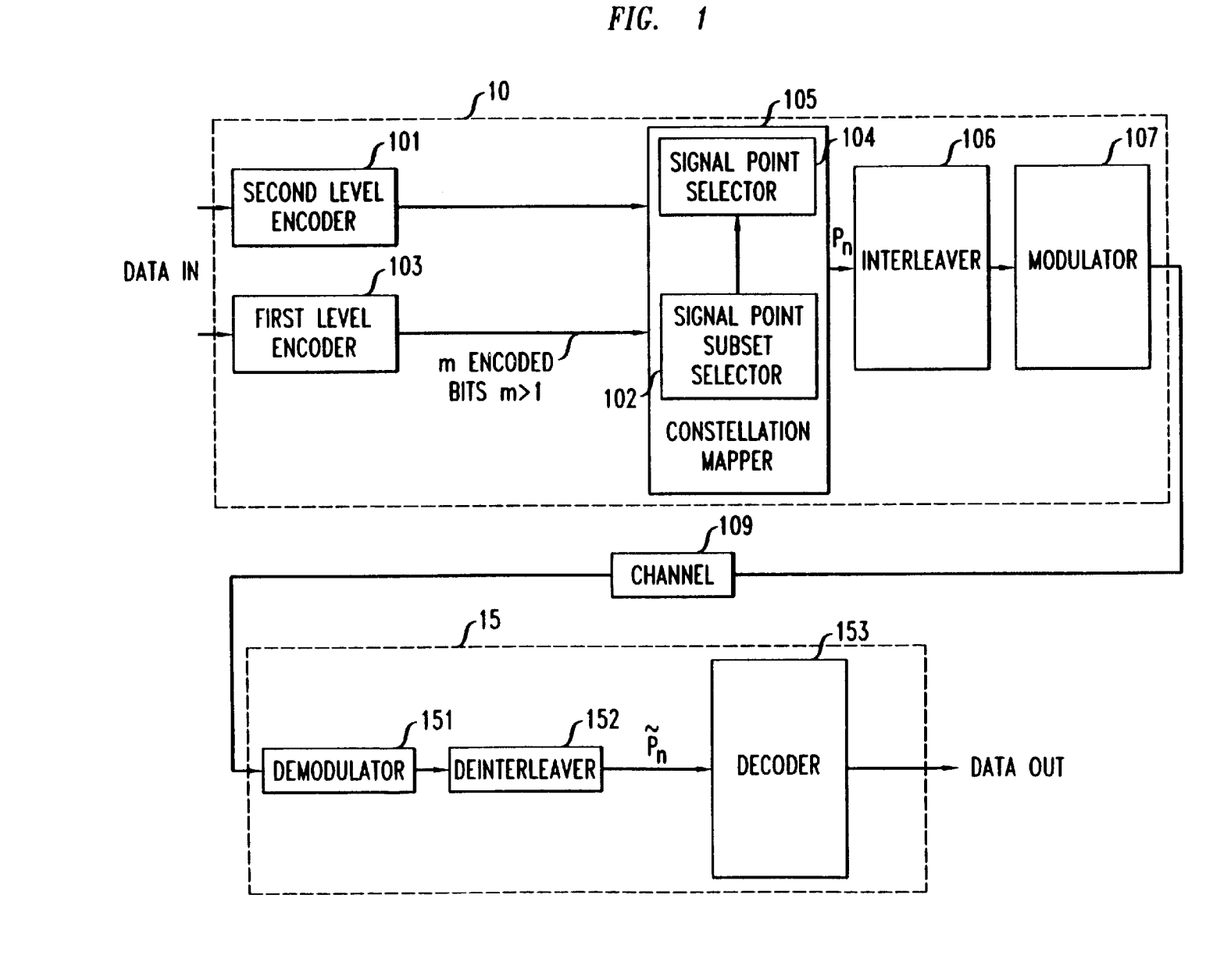
FIG. 1 is a block diagram of a communication system which utilizes a multilevel coded modulation scheme embodying the principles of the present invention.

FIG. 1 is a block diagram of a communications system utilizing a form of trellis coded modulation (TCM)—specifically a multilevel coded modulation scheme embodying the principles of the invention. In overall view, binary data is caused to be represented by signal points which are modulated onto a carrier for transmission over a channel.

In particular, incoming data is supplied to transmitter 10 which includes a first-level encoder 103 and a second-level encoder 101. Constellation mapper 105 includes a signal point subset selector 102 which responds to the m output bits of encoder 103, m>1, to identify particular signal point subsets of a constellation, described in more detail hereinbelow. Constellation mapper 105 also includes signal point selector 104 which responds to the output bits of second-level encoder 101 to select a particular signal point from each identified subset. Interleaver 106 interleaves the selected signal points, which are then supplied to modulator 107 for transmission over channel 109 which is illustratively a wireless telecommunications channel.

Receiver 15 receives transmitted signal points which were corrupted in the channel by noise and other impairments such as multipath fading. Receiver 15 includes demodulator 151 and deinterleaver 152 which perform the inverse operations of modulator 107 and interleaver 106, respectively. The output of deinterleaver 152 is applied to decoder 153 which recovers the transmitted data.

Figure 2:
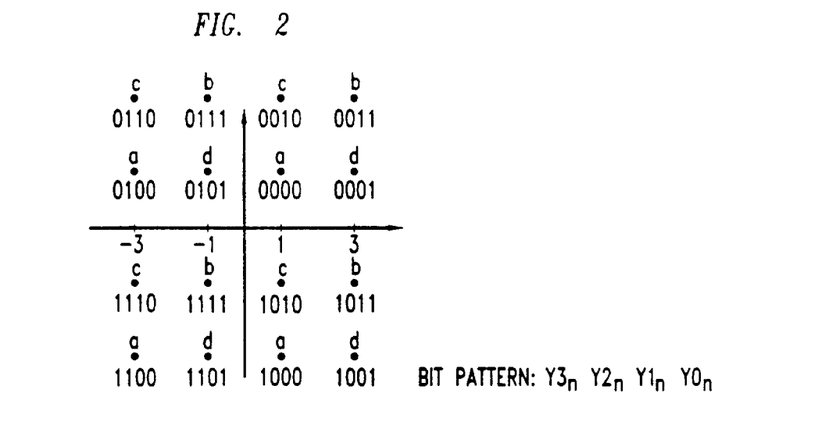
FIG. 2 shows a two-dimensional 16-QAM constellation, partitioned into four signal point subsets, used in the transmitter of FIG. 1.

Each such signal point is illustratively a point in a predetermined 2D constellation-illustratively shown in FIG. 2 as being a 16-QAM constellation, that is a QAM constellation having a total of 16 signal points. The first-level code is illustratively a four-dimensional (4D) trellis code using a 4D constellation that is formed by concatenating a pair of the 16-QAM constellations. Each 4D symbol—comprising the concatenation of two 2D signal points—is delivered to the channel during a 4D "symbol interval" of duration 2T—or, equivalently, two "signaling intervals" of duration T, with each of the signal points being delivered during a respective one of the signaling intervals. The assemblage of the $16^2$= 256 different 4D symbols comprises a 4D signaling constellation.

Each of the two 2D constituent constellations of the 4D constellation is partitioned into four 2D subsets—denoted a, b, c, and d. FIG. 2 shows by a reference letter which of the four 2D subsets each of the 2D points is assigned to. The 4D constellation is partitioned into eight 4D subsets—denoted in FIG. 3 as subset 0 through subset 7—each 4D subset being comprised of the signal points of two pairs of 2D subsets. For example, 4D subset 0 is comprised of each 4D symbol in which the first and second constituent 2D signal points are both taken from 2D subset a or are both taken from 2D subset b, denoted (a,a) and (b,b). Since there are 256 4D symbols overall and eight 4D subsets, each 4D subset contains 32 4D symbols.

Figure 4:
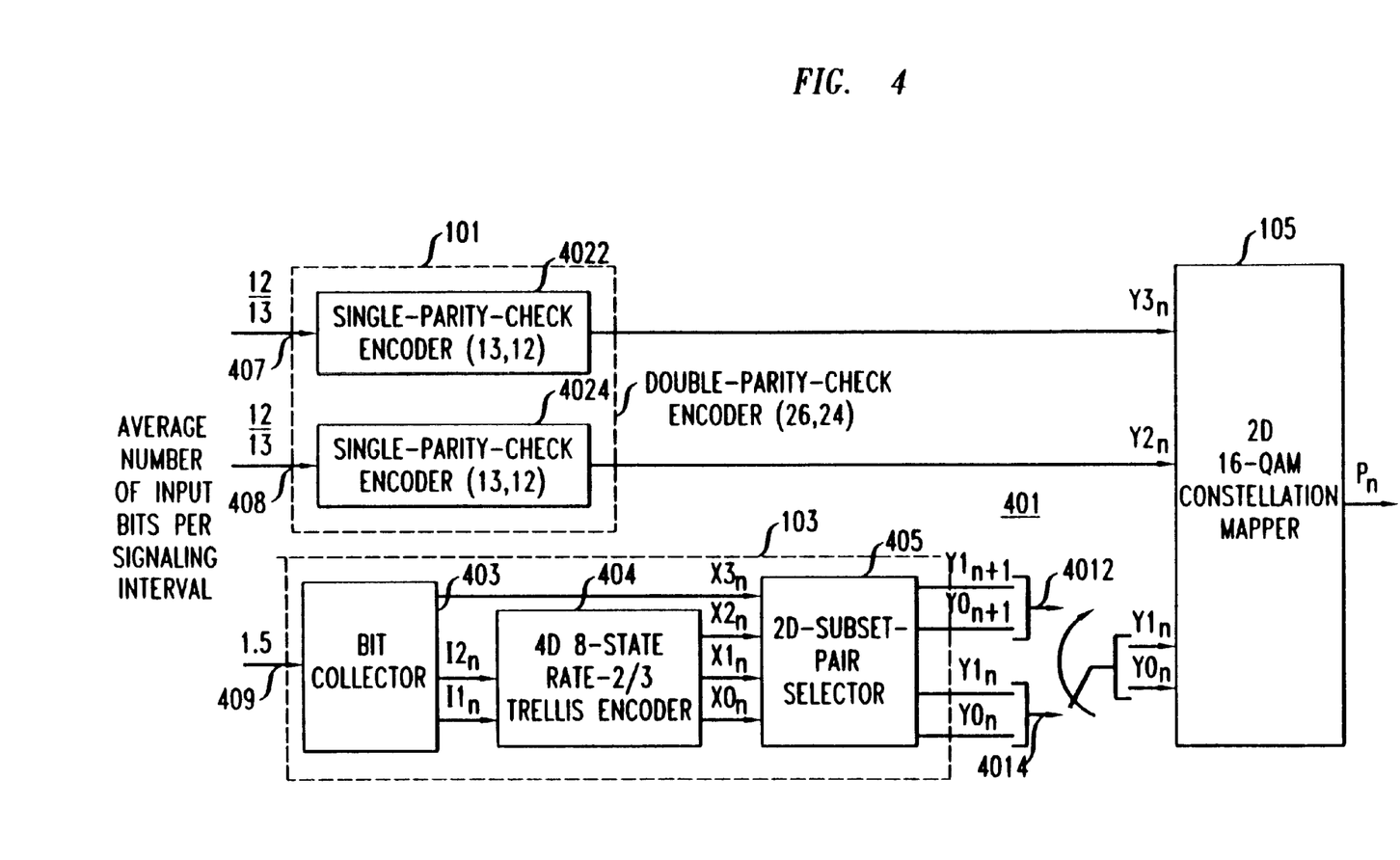
FIG. 4 shows an embodiment for a portion of the transmitter of FIG. 1.

FIG. 4 shows further illustrative details of transmitter 10 (FIG. 1). A portion of the input bits are provided on lead 409 to first-level encoder 103 and the rest are provided on leads 407 and 408 to second-level encoder 101. In a manner to be described in detail below, the output from first-level encoder 103 comprises four bits for every two signaling intervals, those bits being used to identify one of the eight predetermined 4D subsets and, in particular, one of the pairs of 2D subsets comprising that identified 4D subset. The output from the second-level encoder comprises two bits for every signaling interval, those bits being used to select a particular signal point of each identified 2D subset.

Figure 6:
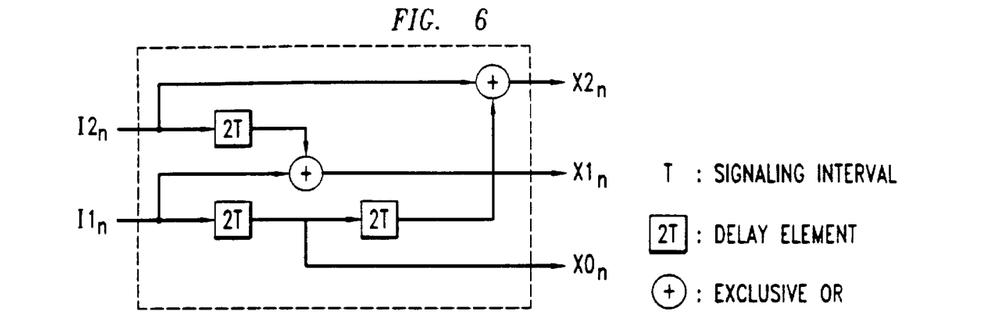
FIG. 6 shows circuitry which implements a particular trellis code used by the trellis encoder of FIG. 4.

Encoder 103 includes bit collector 403, 4D 8-state rate ⅔ trellis encoder 404 and 2D-subset-pair selector 405. Bit collector 403 outputs three bits, $X3_n$, $I2_n$, and $I1_n$, which are associated with two signaling intervals, the $n^{th}$ and $(n+1)^{st}$. It can thus be seen that the average number of input bits supplied to lead 409 per signaling interval is 1.5. Bit $X3_n$ remains uncoded and is provided to 2D-subset-pair selector 405. Bits $I2_n$ and $I1_n$ are supplied to trellis encoder 404. Circuitry implementing the trellis code illustratively used in this embodiment is shown in FIG. 6, wherein each box labeled "2T" is a delay element which provides a delay of 2T seconds and each "+" denotes an exclusive-OR gate.

Figure 3:
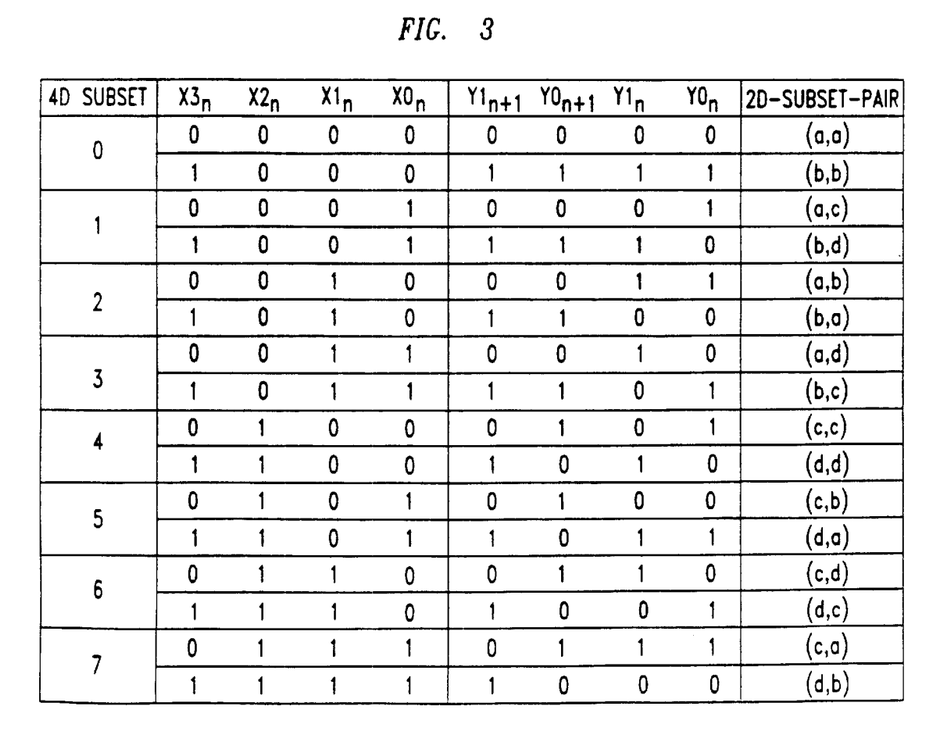
FIG. 3 is a table for partitioning a four-dimensional constellation which, in turn, is based on the constellation of FIG. 2.

The three output bits from trellis encoder 404—bits $X2_n$, $X1_n$, and $X0_n$—are supplied to 2D-subset-pair selector 405. 2D-subset-pair selector 405 converts these bits, as well as the uncoded bit $X3_n$, into another four bits $Y1_{n+1}, Y0_{n+}, Y1_n,$ and $Y0_n$. The table of FIG. 3 shows the details of this conversion. Conceptually, the three bits $X2_n$, $X1_n$, and $X0_n$ are used to identify one of the eight 4D subsets of the 4D constellation; the uncoded bit $X3_n$ is used to identify one of the two 2D-subset-pairs of the identified 4D subset. The value of the bit pattern of $Y1_{n+1}Y0_{n+1}Y1_nY0_n$, the output of 2D-subset-pair selector 405, represents the 2D-subset-pair thus identified. In particular, the bit patterns of $Y1_nY0_n$ that correspond to subsets a, b, c, and d are "00", "11", "10" and "01", respectively, and the same again for $Y1_{n+1}Y0_n+1$.

For example, referring to FIG. 3, if the values of bits $X2_n$ $X1_n$ $X0_n$ are "010", then 4D subset 2 is the one that is identified. If at that time the value of $X3_n$ is "1", the output bits $Y1_{n+1}Y0_{n+1}$ have values of "11" thereby identifying the 2D subset b and the output bits $Y1_nY0_n$ have values of "00" thereby identifying the 2D subset a. The 4D symbol ultimately to be transmitted thus comprises a 2D signal point from subset a and a 2D signal point from subset b.

The particular 2D signal points of those subsets are selected by the second-level code as implemented by second-level encoder 101. For each of k successive 2D signaling intervals (illustratively k=12), one input bit is provided on lead 407 and one input bit is provided on lead 408 to respective single-parity-check encoders 4022 and 4024 which together comprise double-parity-check encoder 101. Those bits appear unchanged as second-level encoder output bits $Y3_n$ and $Y2_n$, respectively. Continuing the above example, these bits are used to select one of the four 2D signal points of the identified subset a for the $n^{th}$ signaling interval and one of the four 2D signal points of the identified subset b for the $(n+1)^{st}$ signaling interval. In the next succeeding, $(k+1)^{st}$, signaling interval, bits $Y3_n$ and $Y2_n$ get their values from encoders 4022 and 4024 respectively. In particular, the value of bit $Y3_n$ ($Y2_n$) is the even parity value of the twelve previous bits on lead 407 (408). Moreover, because only k bits are provided to encoders 4022 and 4024 over (k+1) signaling intervals, the average number of input bits per signaling interval provided on lead 407 and on lead 408, respectively, is k/(k+1) which, in this example, as shown in FIG. 4, is 12/13. The same operations are then carried out by double-parity-checking encoder 101 for the next group of (k+1) intervals, and so on.

2D 16-QAM constellation mapper 105 uses the bits provided by the second- and the first-level encoders to output representations (e.g., x and y coordinates) of the two constituent 2D signal points of the selected 4D symbol to be transmitted, the signal point for the $n^{th}$ signaling interval being $P_n$. In particular, constellation mapper 105 is augmented by element 401 shown schematically as a switch. During signaling interval n, element 401 applies input bits $Y1_nY0_n$ determined by 2D-subset-pair selector 405 from lead 4014 and the second-level encoder provides bits $Y3_n$ and $Y2_n$ as described above. During signaling interval n+1, element 401 applies input bits $Y1_{n+1}Y0_{n+1}$ from lead 4012 and the second-level encoder provides bits $Y3_{n+1}$ and $Y2_{n+1}$. Thus, over the two signaling intervals—the $n^{th}$ and $(n+1)^{st}$—a total of eight bits are provided to constellation mapper 406: $Y3_{n+1}, Y2_{n+1}, Y3_n,$ and $Y2_n$ from the second-level code and $Y1_{n+1}, Y0_{n+1}, Y1_n$ and $Y0_n$ from the first-level code. The values of bits $Y3_{n+1}Y2_{n+1}Y1_{n+1}Y0_{n+1}$ are used to select the first of the constituent 2D signal points of the selected 4D symbol, $P_n$. The values of bits $Y3_nY2_nY1_nY0_n$ are used to select the second of the constituent 2D signal points of $P_n$. For example, if the bit pattern for $Y3_nY2_nY1_nY0_n$ or for $Y3_{n+1}Y2_{n+1}Y1_{n+1}Y0_{n+1}$ is "0011", the 2D signal point in the upper-right hand corner of the first quadrant of the constellation of FIG. 2 is selected.

A TCM scheme is said to exhibit a certain level of time diversity, the value of which is equal to the minimum number of signal point positions in any two valid sequences of signal points at which the points are different. For example, a scheme exhibits a time diversity of "2" if any valid sequence of signal points differs from every other valid sequence in at least 2 signal point positions. As a result of this time diversity, as long as at most one signal point of a sequence is lost—perhaps due to fading in a cellular environment—it is always possible to recover the transmitted information and thereby improve overall error performance, as illustrated by example hereinbelow.

The first-level code used in the present illustrative embodiment does not, in and of itself, provide the overall code with time diversity M>1. On the one hand, it can be said of that first-level code that any valid sequence of signal point subsets differs from every other valid sequence of signal point subsets in at least 2 subset positions. Thus, if every subset of the constellation was comprised of only one signal point, the overall code would exhibit a time diversity of 2 because each valid sequence of subsets corresponds to only one valid sequence of signal points.

However, here each signal point subset contains four signal points—not just one. As a result, the first-level code alone—even if it ensures that any valid sequence of signal point subsets differs from every other valid sequence of signal point subsets in at least two subset positions—is not enough to ensure that the overall code exhibits a time diversity of 2. This is because, unless steps are taken to preclude it, two sequences of signal points selected from the same sequence of signal point subsets can differ in only one signal point position.

I have realized that by choosing certain second-level codes, the overall code may be made to exhibit the desired level of time diversity. For example, as described in detail hereinbelow, the double-parity-check code in the illustrative embodiment described above ensures that the overall code exhibits a time diversity of 2, given that, as is indeed the case, the first-level code is such that any valid sequence of signal point subsets differs from every other valid sequence of subsets in at least 2 subset positions. In particular, the double-parity-check code is such that if two sequences of k(=12) signal points differ from each other in only one signal point position, the parity bits appended to each sequence will necessarily differ so that the resulting sequences of k+1(=13) signal points will differ in two signal point positions. Advantageously, the "cost" for achieving this increase in time diversity is quite small—a loss in bandwidth efficiency of 2/(k+1) bits/signal point and a only a modest increase in the complexity of the decoder relative to a unilevel TCM scheme which is the same as that shown in FIG. 4 but without the second-level code. As noted above, the use of the first-level code and the particular second-level code provides an over code having the desired time diversity of M>1 and in which the minimum distance of the overall code is not increased by virtue of the presence of the second-level code.

Figure 5:
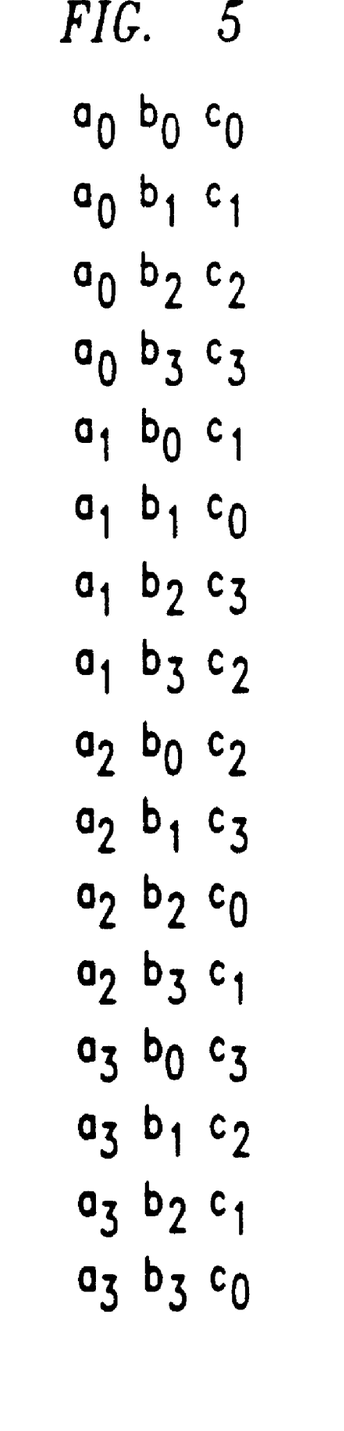
FIG. 5 is an example useful in explaining time diversity.

The concept of time diversity may be further understood by considering FIG. 5, which illustrates a simple example for k=2. Using the notation of $x_i$ to denote $x_i$ as the signal point within signal point subset x whose bit pattern $Y3_n Y2_n$ is equal to the decimal equivalent of i. FIG. 5 shows a set of three-signal-point sequences (corresponding to two data bits and one parity bit) taken from a particular one sequence of subsets a, b, and c—that sequence being abc. Each subset has four signal points, i.e., i=0,1,2,3. Note that every sequence of signal points differs from any other sequence in at least two signal point positions. Assume by way of example that the sequence $a_2 b_1 c_3$ was transmitted but that due to, for example, a deep fade, the middle signal point $b_1$ is lost and only $a_2\_c_3$ is received by the receiver. Assuming that the correct subset sequence abc has already been determined correctly through the decoding process for the first-level code, as described below, one can then verifying that the receiver, having knowledge of the valid signal point sequences for that subset sequence (as shown in FIG. 5), can determine unambiguously that the lost signal point must have been $b_1$, given that the sequence begins with $a_2$ and terminates with $c_3$. However, if even one pair of three-signal-point sequences were to differ from another in only one signal point position, there would be no such guarantee and, indeed, a code having such a set of valid sequences would be said to having time diversity M=1.

Figure 7:
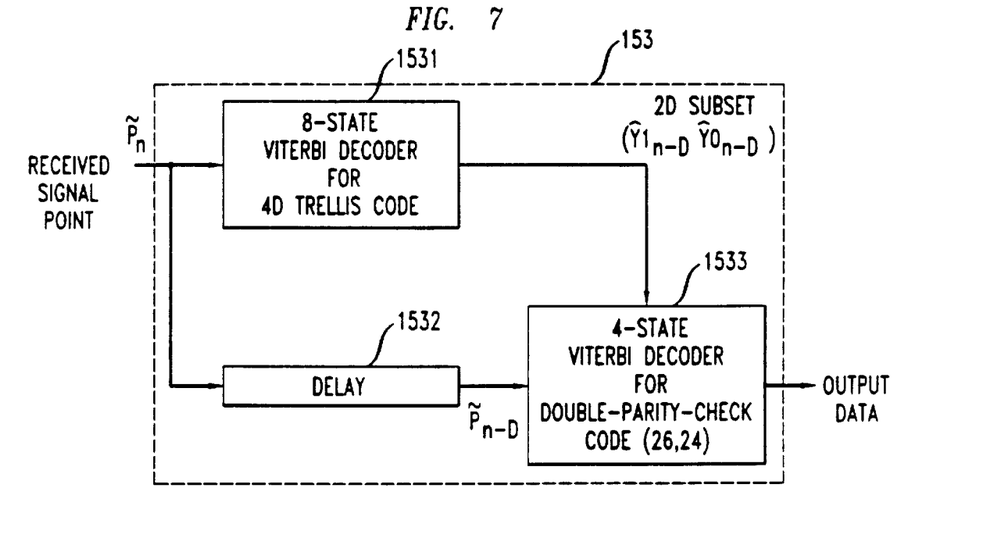
FIG. 7 depicts an embodiment of a two-stage decoder used in the receiver of FIG. 1.

FIG. 7 depicts an embodiment of decoder 153, which is illustratively a two-stage decoder comprised of a first-stage eight-state Viterbi decoder 1531 for decoding those bits which had been encoded with the first-level 4D trellis code, and a second-stage four-state Viterbi decoder 1533 for decoding those bits which had been encoded with the second-level double-parity-check code.

Specifically, for each received channel-impaired signal point $\tilde{P}_n$, the first-stage decoder 1531 forms, in a well-known manner, a delayed decision on the bits $Y1_{n-D}$ and $Y0_{n-D}$ as to the identity of the signal point subset from which an earlier received signal point $\tilde{P}_{n-D}$ was taken, where D is the decoding delay occuring within decoder 1531. The second-stage decoder 1533 is then used to further decide the remaining bits $Y3_{n-D}$ and $Y2_{n-D}$. In particular, decoder 1533 receives decoder 1531's signal point subset estimate $Y1_{n-D}Y0_{n-D}$. At the same time, decoder 1533 receives the delayed channel-impaired signal point $\tilde{P}_{n-D}$ provided by delay element 1532. Given an identification of the signal point subset, decoder 1533 can then process the received signal point to determine which signal point within that subset was transmitted and thus to recover bits $Y3_{n-D}$ and $Y2_{n-D}$.

The operation of Viterbi decoder 1533 is best explained by recognizing that the double-parity-check code can be represented as a four-state encoder having four states, "00", "01", "10", "11" denoted for convenience as "0" through "3". The current state reflects the current double parity, as each input bit of a sequence of k input bits for each encoder (values for bits $Y3_n, Y2_n$) is received. That is, the current state reflects (a) the parity of the input bits previously received by encoder 4022 (values of the $Y3_n$ bits) and (b) the parity of the input bits previously received by encoder 4024 (values of the Y2 bits). For example, state "01" means that the parity of the input bits previously received by encoder 4022 at that point in time is "0" and the parity of the input bits previously received by encoder 4024 at that point in time is "1".

As input bits associated with signaling intervals other than every $(k+1)^{st}$ signaling interval are received, the encoders provide them as values for Y3 and Y2 and transition to a next state. For example, if the current state of encoder 101 is "1" and the input bits received are "10", the encoder advances to a next state "3" and provides values of "1" and "0", respectively, for bits Y3 and Y2. At the $(k+1)^{st}$ signaling interval, the current double parity as indicated by the current state of the encoder (leftmost column in FIG. 8), is then provided as an output, returning the encoder to state 0. The process then repeats for the next (k+1) signaling intervals.

Figure 8:
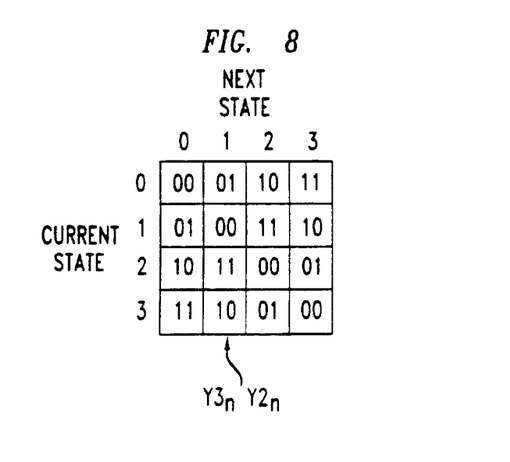
FIG. 8 shows a state transition diagram for the double-parity-check encoder of FIG.4.
Figure 10:
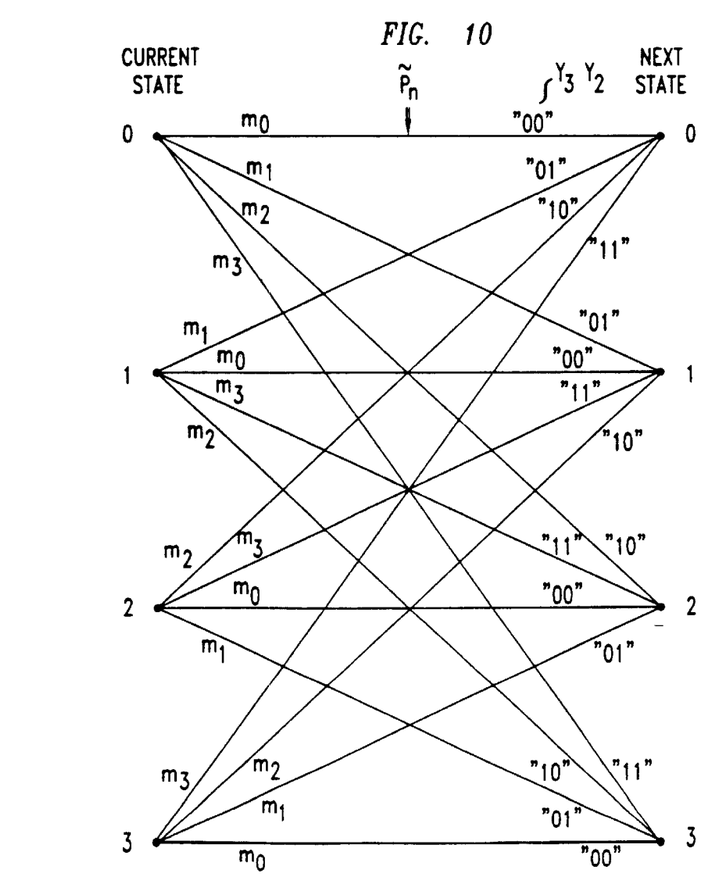
FIG. 10 shows a trellis diagram representing the operation of the 4-state decoder of FIG. 7.
Figure 11:
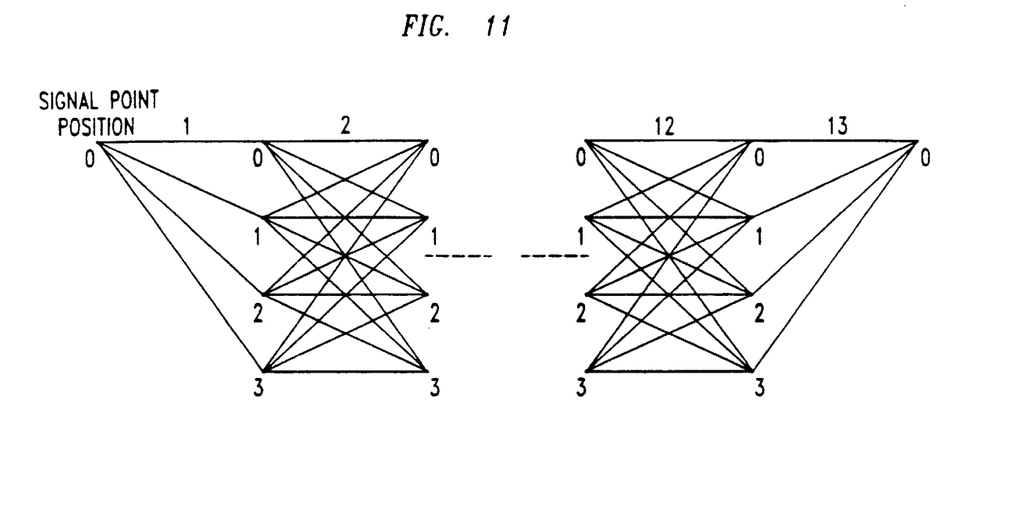
FIG. 11 shows a trellis that forms the basis of the operation of the 4-state decoder of FIG. 7, that trellis being based on the trellis diagram of FIG. 10.

The representation of the double-parity-check code shown in FIG. 8 can alternatively be shown as a trellis diagram—specifically the trellis diagram of FIG. 10. The fact that each current state is connected by a branch of the trellis diagram to each other state reflects the fact that the double-parity-check code can transition from any one of its four states to any other one of its four states at any time. Each branch is labeled by the particular pair of values of bits $Y3_n Y2_n$ associated with the transition between the current and next states, per FIG. 8. Each branch is thus also associated with the signal point that was selected in response to those bit values in the transmitter. The overall code, extending over (k+1) signaling intervals, can thus be represented by the trellis of FIG. 11. The code always begins in state 0, as indicated above, traverses (k−1) concatenations of the FIG. 10 trellis, and always terminates in state 0, as also indicated above.

Figure 9:
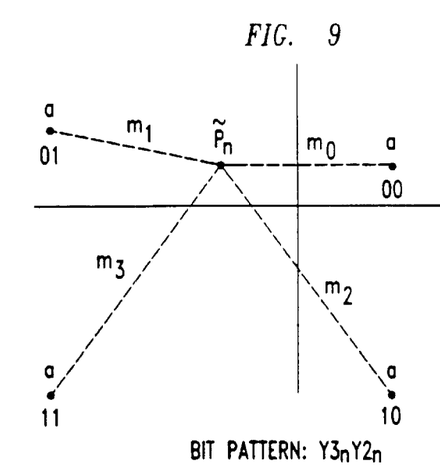
FIG. 9 is a drawing helpful in explaining the operation of the 4-state decoder of FIG. 7.

Given such a trellis representation, decoder 1533 can advantageously be implemented as a conventional Viterbi decoder. As shown in FIG. 9, as each signal point $\tilde{P}_{n-D}$ is received, its distance $m_j$ to the $j^{th}$, j=0,1,2,3, of the signal points of the subset that was identified by decoder 1531 is measured. The distance $m_j$ serves as the branch metric for the four branches of the trellis diagram associated with the $j^{th}$ signal point. The branch metrics are added to the path metrics accumulated for each state in conventional fashion. The path with the smallest path metric leading into each state is retained at each stage of the decoding and the others are discarded. After the $(k+1)^{st}$ signal point has been received, the transmitted signal points of the identified subsets are determined by tracing back along the retained path leading into end state 0.

That this decoding process enables the decoder to exploit the fact that the code has time diversity M=2 can be understood as follows: Assume there is a deep fade at one of the signal point positions. The branch metrics for all branches at that point in the trellis will all be the same. (In a QAM environment the fact that the carrier has faded effectively causes the receiver to regard all signal points as being at the origin; in a PSK environment the faded signal point, since it is at the origin will be equidistant from all signal points, since the latter lie on a circle.) The surviving paths into each of the four decoder states at point in the trellis immediately after the fade will all emanate from the particular state which had the smallest accumulated path metric prior to the fade and they will all have the same accumulated path metric since the branch metrics are all the same. Thus each of the four possible bit patterns represented by the faded signal point are retained in one of the four surviving paths. Moreover, it can be shown that because the code has time diversity M=2, then the transmitted sequence of signal points will differ from all other valid sequences in at least one signal point position going forward in the trellis from just after the fade. One can thereupon trace back along the final surviving path, beginning at the final state 0, to a particular one of the four states immediately following the fade and thence back to the starting state 0 of the trellis. The decoder thus provide its best estimate of the entire transmitted sequence, including the faded signal.

Figure 12:
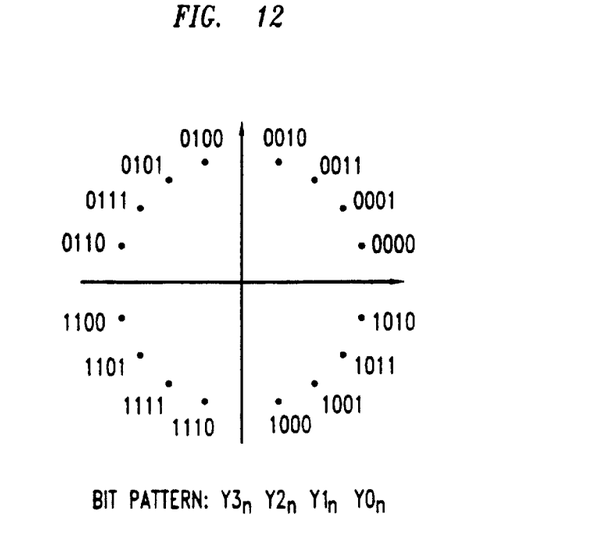
FIG. 12 shows a 16-PSK constellation, partitioned into four signal point subsets, than can be used in the transmitter of FIG. 1 as an alternative to the 16-QAM constellation of FIG. 2.

The foregoing merely illustrates the invention. For example, different codes, bit rates, constellations, and partitioning may be used. In particular, the use of a 16-QAM constellation requires a rather precise estimation of the strength and carrier phase of the received signal. Thus, for example, constellation mapper 105 in FIG. 4 may utilize the 16-PSK constellation of FIG. 12 instead of the 16-QAM constellation of FIG. 2, all other aspects of the coding being as already described. In addition, the stream of points of the 16-PSK constellation may be transmitted in a differential form pursuant to conventional 16-DPSK modulation.

Figure 13:
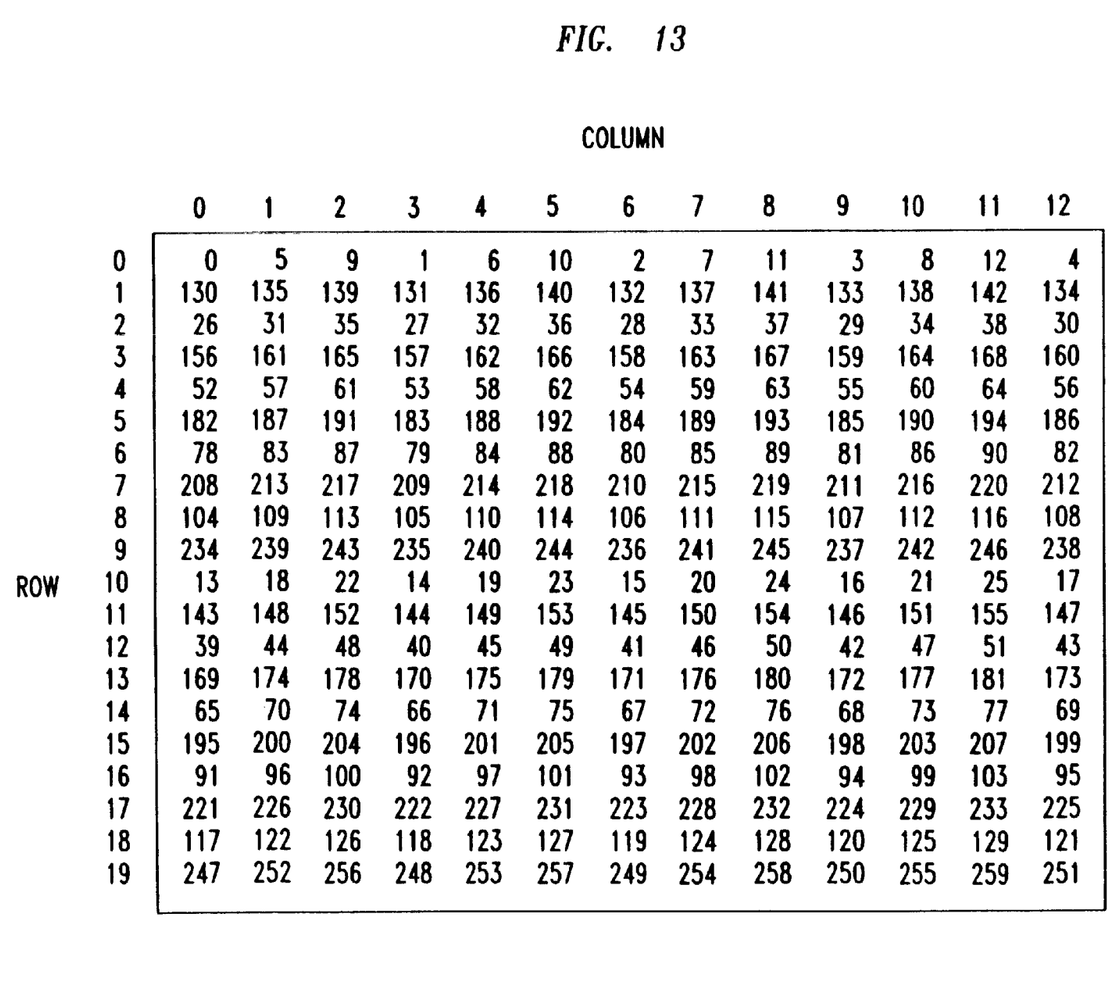
FIG. 13 is a matrix helpful in explaining the operation of the interleaver shown in FIG. 1.

Interleaver 106 effectively provides wide separation in time over the channel between successive signal points at the output of constellation mapper 105. Interleaver 106 is "matched" to the code, meaning, as is well known, that to the extent possible, signal points at positions which effectuate the time diversity of the code should be as far apart as possible when traversing the channel. Interleaver 106 operates pursuant to the general teachings of my U.S. Pat. No. 5,056,112, titled "Interleaving in Coded Modulation for Mobile Radio" and in Lee-Fang Wei, "Coded M-DPSK with Built-In Time Diversity for Fading Channels," *IEEE Trans. Inform. Theory*, vol. IT-39, pp. 1820–1839, November 1993. In particular, let each group of 260 signal points at the output of constellation mapper 105 be numbered from 0 to 259. Within interleaver 106, these signal points are read into an interleaving matrix comprising 20 rows and 13 columns following the scheme shown in FIG. 13. That is, the $0^{th}$ signal point is read into the location at row 0, column 0; the $1^{st}$ signal point is read into the location at row 0, column 3; and so on. After all 260 signal points have been read into the interleaver in this way, they are read out column-by-column from top to bottom in each column. Thus the interleaver output sequence comprises the signal points numbered 0, 130, 26, . . . , 247, 5, 135, etc.

Moreover, it will be appreciated by those skilled in the art that the block diagrams herein represent conceptual views of illustrative circuitry embodying the principles of the invention. The functions of the various elements shown in the FIGS. would, in preferred embodiments, be implemented by one or more programmed processors, digital signal processing (DSP) chips, or the like rather than individual hardware elements.

In the claims hereof any element expressed as a means for performing a specified function is intended to encompass any way of performing that function including, for example, a) a combination of circuit elements which performs that function or b) software in any form (including, therefore, firmware, microcode or the like) combined with appropriate circuitry for executing that software to perform the function. The invention defined by such claims resides in the fact that the functionalities provided by the various recited means are combined and brought together in the manner which the claims call for. Applicant thus regards any means which can provide those functionalities as equivalent as those shown herein.

It will be appreciated by those skilled in the art that they will be able to devise various arrangements which, although not explicitly shown or described herein, embody the principles of the invention and thus are within its spirit and scope.

What is claimed:

1. A method for use in a multilevel coded modulation arrangement comprising the steps of encoding a first portion of a stream of input data using a first code, encoding a second portion of said stream of input data using a second code, generating sequences of signal points selected from a predetermined signaling constellation in response to the encoded first and second portions, said first code identifying sequences of signal point subsets, and applying said sequences of signal points to a channel, characterized in that said first code is such that every different pair of identified sequences of signal point subsets differs in at least M subset positions, where M is a desired level of time diversity, and said second code is such as to ensure that every different pair of valid sequences of signal points taken from the same sequence of signal differs in at least M signal point positions thereby providing an overall multilevel code of said desired level of time diversity and thereby does not cause an increase in the minimum distance between different ones of the sequences of signal points of said overall multilevel code.

2. The method of claim 1 wherein said first code provides more than one output bit per generated signal point.

3. The method as defined in claim 2 wherein said first code is an N-dimensional trellis code with N>2.

4. The method as defined in claim 2 wherein said second code is a parity check code.

5. The method of claim 1 wherein said first code is an N-dimensional trellis code with N>2.

6. The method of claim 1 wherein said second code is a parity check code.

7. The method as defined in claim 1 wherein said desired level of time diversity is M>1.

8. The method as defined in claim 7 wherein said desired level of time diversity is M=2.

9. The method as defined in claim 7 wherein said first code is an N-dimensional trellis code with N>2.

10. The method as defined in claim 9 where N=4 and wherein said second code is a double parity check code.

11. The method as defined in claim 7 wherein said second code is a double parity check code.

* * * * *